United States Patent
Kasai

(10) Patent No.: US 11,430,495 B2
(45) Date of Patent: Aug. 30, 2022

(54) SEMICONDUCTOR STORING APPARATUS INCLUDING MULTIPLE CHIPS AND CONTINOUS READOUT METHOD

(71) Applicant: Winbond Electronics Corp., Taichung (TW)

(72) Inventor: Takamichi Kasai, Kanagawa (JP)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 17/165,945

(22) Filed: Feb. 3, 2021

(65) Prior Publication Data
US 2021/0327481 A1    Oct. 21, 2021

(30) Foreign Application Priority Data
Apr. 20, 2020    (JP) .............................. JP2020-074498

(51) Int. Cl.
*G11C 7/22*    (2006.01)
*G11C 7/10*    (2006.01)

(52) U.S. Cl.
CPC ............ *G11C 7/222* (2013.01); *G11C 7/1021* (2013.01); *G11C 7/1048* (2013.01); *G11C 7/1054* (2013.01)

(58) Field of Classification Search
None
See application file for complete search history.

(56) References Cited

U.S. PATENT DOCUMENTS

| | | | |
|---|---|---|---|
| 4,477,741 A * | 10/1984 | Moser, Jr. | ........ H03K 19/00315 326/57 |
| 5,517,129 A | 5/1996 | Matsui | |
| 6,324,114 B1 * | 11/2001 | Himeno | .............. G06F 12/0623 365/230.06 |
| 9,348,786 B2 | 5/2016 | Gillingham | |

(Continued)

FOREIGN PATENT DOCUMENTS

| | | |
|---|---|---|
| CN | 102096647 | 3/2016 |
| JP | H0547185 | 2/1993 |

(Continued)

OTHER PUBLICATIONS

"Office Action of Japan Counterpart Application", dated Apr. 28, 2021, p. 1-p. 5.

(Continued)

*Primary Examiner* — J. H. Hur
(74) *Attorney, Agent, or Firm* — JCIPRNET

(57) ABSTRACT

A semiconductor storing apparatus capable of performing continuous readout between multiple chips in high speed is provided. A NAND-type flash memory includes the stacked multiple chips. Each of the chips includes: a readout part performing the continuous readout; an output buffer part outputting data readout from the readout part to input/output bus synchronously with a clock signal; and a final page detecting part detecting if readout pages are the final pages of the chips. The output buffer part responds to a detecting result of the final pages under a condition of performing the continuous readout between the chips. After outputting the data of the final pages through a first output buffer with a large driving capability, outputs or holds the data of the final pages through a second output buffer with a little driving capability.

10 Claims, 6 Drawing Sheets

(56) References Cited

U.S. PATENT DOCUMENTS

| | | |
|---|---|---|
| 2004/0006658 A1 | 1/2004 | Chae et al. |
| 2004/0236898 A1 | 11/2004 | Okumura |
| 2014/0269121 A1 | 9/2014 | Takahashi et al. |

FOREIGN PATENT DOCUMENTS

| | | |
|---|---|---|
| JP | H05233435 | 9/1993 |
| JP | H11176165 | 7/1999 |
| JP | 2003051194 | 2/2003 |
| JP | 2004039211 | 2/2004 |
| JP | 2014078301 | 5/2014 |
| JP | 2015076109 | 4/2015 |
| KR | 20180019418 | 2/2018 |
| TW | I490863 | 7/2015 |
| TW | 201931365 | 8/2019 |
| WO | 03015102 | 2/2003 |

OTHER PUBLICATIONS

"Office Action of Korea Counterpart Application", with English translation thereof, dated May 31, 2022, p. 1-p. 7.

\* cited by examiner

SEMICONDUCTOR STORING APPARATUS INCLUDING MULTIPLE CHIPS AND CONTINOUS READOUT METHOD

CROSS-REFERENCE TO RELATED APPLICATION

This application claims the priority benefit of Japan application serial no. 2020-074498, filed on Apr. 20, 2020. The entirety of the above-mentioned patent application is hereby incorporated by reference herein and made a part of this specification.

BACKGROUND

1. Technical Field

The disclosure relates to a NAND-type flash memory and the like, and more particularly to a readout method of a flash memory including multiple chips.

2. Description of Related Art

In order to achieve interchangeability with NOR-type flash memory, sometimes the NAND-type flash memory is equipped with a function of continuously reading out multiple pages in response to external commands. For example, the NAND flash memory of Japanese Unexamined Patent Application Publication No. 2014-078301 inputs the readout mode command in response to the external control signal CLE, then inputs address in response to the external control signal ALE, and then inputs the command for the readout of pages in response to the external control signal CLE, thereby enabling continuous readout of pages from the memory cell array.

SUMMARY

Compared with NOR-type flash memory, NAND-type flash memory has a slower readout speed. Therefore, the data transfer rate is prevented from decreasing by continuously reading out large-size data. In addition, in order to increase memory capacity, for NAND-type flash memory, there are multi-chip package (MCP) in which multiple chips (die) are stacked in one package.

In such type of MCP product, continuous readout of larger-sized data between chips is required. However, in the existing MCP products, data between physically separated chips is not shared, and the readout addresses of other chips are not recognized, so continuous readout of the entire chip cannot be performed. In other words, when performing continuous readout between chips, a command must be input for continuous readout of the current chip, and a command must be input for continuous readout of the next chip after the readout of the current chip is completed.

FIG. 1 is a diagram showing an address space of a conventional flash memory having two stacked chips. Chip #0 has an address space of $00000~$0FFFF, and chip #1 has an address space of $10000~$1FFFF. In the case of continuous readout using such flash memory, if the command and address (row address and column address) of the continuous readout are input, each chip determines whether itself has been selected based on the input address. For example, if the input address matches the address space of $00000~$0FFFF, chip #0 determines that itself has been selected. If the input address matches the address space of $10000~$1FFFF, chip #1 is determined that itself has been selected.

For the selected chip, readout is performed with the row address specified by the input address as a start page, and then, the row address is automatically incremented. When the row address reaches the final page, the continuous readout ends. The final page is determined, for example, by the final address of the address space of the selected chip or an address designated by the user. To perform continuous readout between chip #0 and chip #1, the user must input the command and address for continuous readout of the chip #0, and then the command and address for continuous readout of the chip #1.

In the conventional flash memory including multiple chips as described above, there is a problem that it does not deal with continuous readout between the chips, and continuous readout of the entire chip cannot be seamlessly performed.

The disclosure solves such existing problems, and aims to provide a semiconductor storing apparatus capable of performing continuous readout between multiple chips at high speed.

A semiconductor storing apparatus of the disclosure includes multiple NAND flash memory chips, where in the semiconductor storing apparatus, each of the chips includes: a readout part performing a continuous readout; an output part outputting data readout from the readout part to an output bus synchronously with a clock signal; and a detecting part detecting if a readout page read out by the readout part is a final page of the chip. The output part, under a condition of performing the continuous readout between the chips by the readout part, responds to a detecting result of the detecting part, outputs data of the final page through a first output impedance, and then outputs or holds the data of the final page through a second output impedance higher than the first output impedance.

According to an embodiment of the disclosure, the output part includes: a first output buffer having a first output impedance; and a second output buffer having a second output impedance; where the output part selectively operates the first output buffer or the second output buffer based on a detecting signal from the detecting part. According to an embodiment of the disclosure, the output part responds the final page being detected, operates the first output buffer in a first period, and operates the second output buffer in a second period after the first period.

According to an embodiment of the disclosure, the first period is longer than the second period. According to an embodiment of the disclosure, when a period of outputting the data of the final page of a first chip partially overlaps a period of outputting the data of the start page of a second chip, the data of the final page is output to the output bus through the second output impedance and the data of the start page is output to the output bus through the first output impedance. According to an embodiment of the disclosure, the detecting part detects the final page by comparing count data of a row address counter with an address space of the chip. According to an embodiment of the disclosure, the multiple chips have the same configuration, and the multiple chips are respectively connected to a shared external terminal.

A readout method of the disclosure for a semiconductor storing apparatus, the semiconductor storing apparatus including multiple NAND-type flash memory chips, and the readout method including: a first step, detecting a final page of the chip read out when a continuous readout is performed between the chips synchronously with a clock signal; and a second step, responding to the final page being detected, outputting data of the final page to an output bus through a first output impedance, and then outputting or holding the data of the final page to the output bus through a second output impedance higher than the first output impedance.

According to an embodiment of the disclosure, the second step outputs the data of the final page through a first output buffer in a first period, and outputs or holds the data of the final page through a second output buffer in a second period after the first period. According to an embodiment of the disclosure, the first period is longer than the second period. According to an embodiment of the disclosure, when a period of outputting the data of the final page of a first chip partially overlaps a period of outputting the data of the start page of a second chip, the data of the final page is output to the output bus through the second output impedance, and the data of the start page is output to the output bus through the first output impedance. According to an embodiment of the disclosure, the detecting step detects the final page by comparing count data of a row address counter with an address space of the chip.

According to the disclosure, under a condition of performing the continuous readout between the chips, after outputting the data of the final page through the first output impedance, the data of the final page is output or held through the second output impedance higher than the first output impedance, therefore the continuous readout between the chips can be performed seamlessly at high speed.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
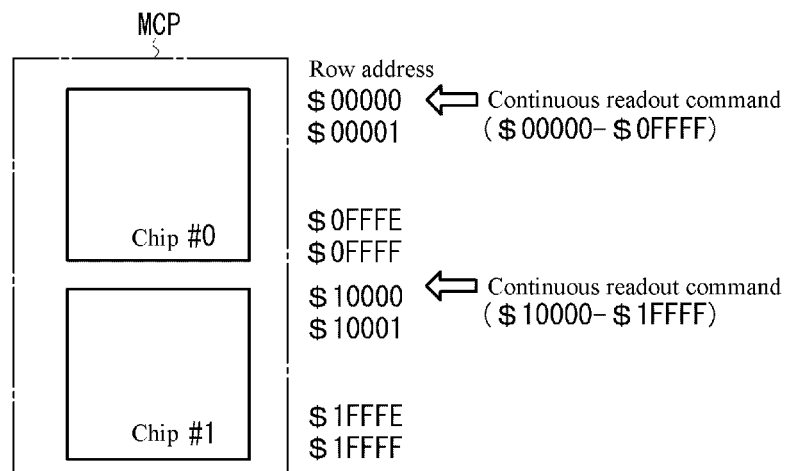
FIG. 1 is a diagram showing an address space of a conventional flash memory having multiple chips.

Reference will now be made in detail to the exemplary embodiments of the disclosure, examples of which are illustrated in the accompanying drawings. Wherever possible, the same reference numbers are used in the drawings and the description to refer to the same or like parts.

The semiconductor storing apparatus of the disclosure may be a NAND-type flash memory having multiple chips, or a microprocessor, microcontroller, logic, application specific integrated circuits (ASIC) embedded in such flash memory, a processor that processes images or sounds, a processor that processes signals such as wireless signals, and the like.

Figure 2:
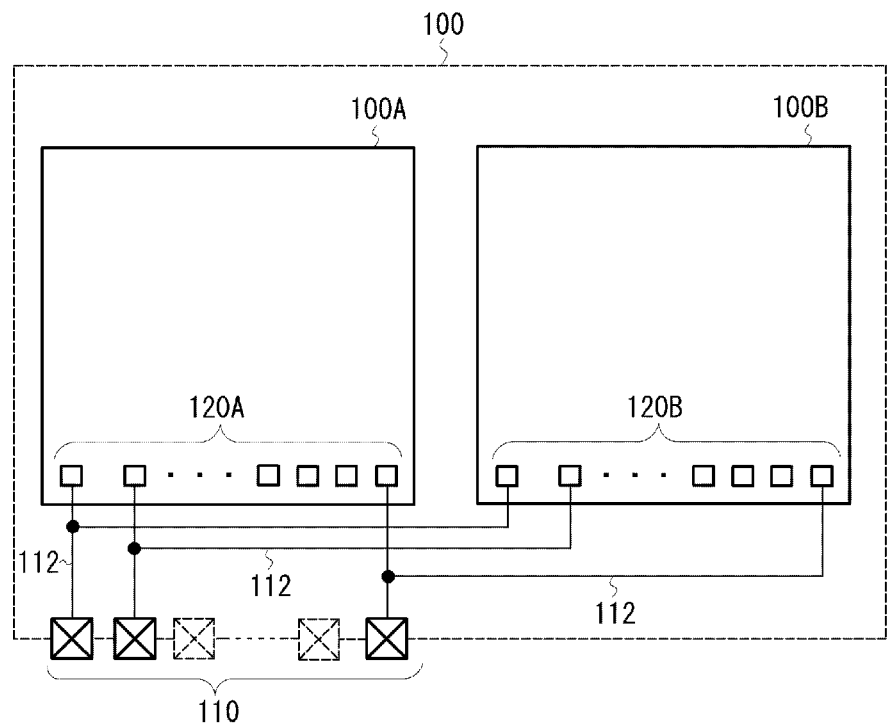
FIG. 2 is a diagram showing a connection relationship between internal pads and external terminals of stacked chips in the package of the NAND-type flash memory according to an embodiment of the disclosure.

Next, embodiments of the disclosure will be described in detail with reference to the drawings. FIG. 2 is a diagram showing a connection relationship between internal pads and external terminals of stacked chips in the package of the NAND-type flash memory according to an embodiment of the disclosure. A NAND-type flash memory 100 of the disclosure includes multiple memory chips stacked in a package. For example, the multiple memory chips are packaged in packages such as ball grid array (BGA) or chip scale package (CSP). FIG. 2 shows an example of two stacked memory chips 100A and 100B. The two memory chips 100A and 100B may be chips of the same configuration; for example, the memory chip 100A corresponds to a chip #0 with the address space ($00000~$0FFFF) as shown in FIG. 1, and the memory chip 100B corresponds to a chip #1 with the address space ($10000~$1FFFF) as shown in FIG. 1.

The flash memory 100 includes multiple external terminals 110 functioning as an input/output interface with the outside. The external terminal 110 is formed in a package such as CSP or BGA. The external terminal 110 inputs commands (such as reading, writing, erasing), addresses, data, and the like from a host computer not shown, or outputs the data read out, and the like. When the flash memory 100 is equipped with a serial peripheral interface (SPI) function, the external terminal 110 includes a clock terminal for inputting a clock signal. The external terminal 110 may also include a control terminal for inputting control signals such as an Address Latch Enable or a Command Latch Enable.

Via an internal wiring 112, the external terminal 110 is electrically connected to a corresponding internal pad 120A of the memory chip 100A and electrically connected to a corresponding internal pad 120B of the memory chip 100B. In this way, the external terminal 110 is electrically connected to the internal pad 120A of the memory chip 100A and the internal pad 120B of the memory chip 100B in a shared manner.

Figure 3:
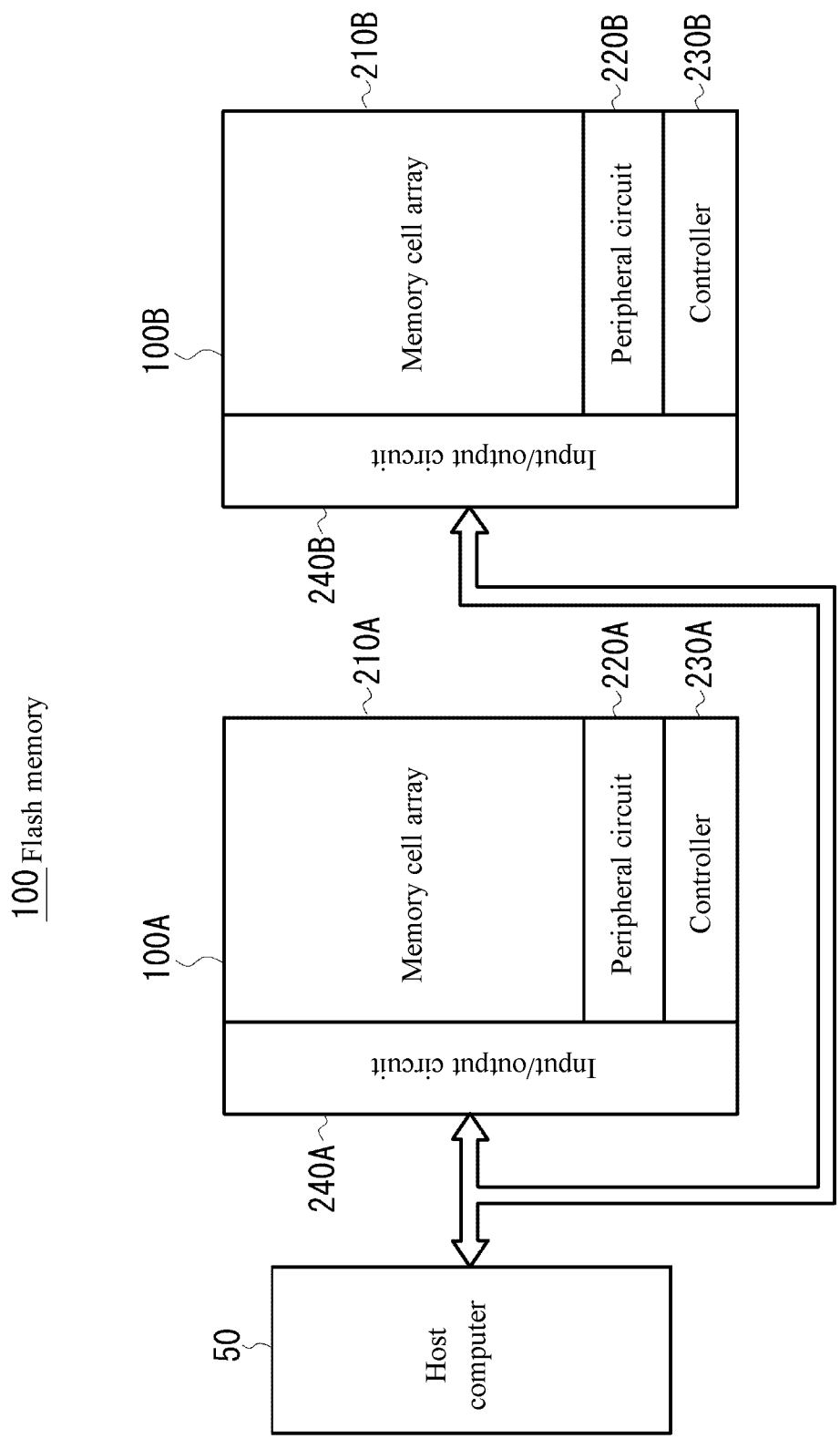
FIG. 3 is a diagram showing a connection relationship between chips provided in the NAND-type flash memory according to an embodiment of the disclosure.

FIG. 3 is a block diagram showing the internal configuration of each chip of the flash memory 100 of the present embodiment. The memory chip 100A includes a memory cell array 210A formed having multiple NAND strings, a peripheral circuit 220A formed having a row selection circuit or a page buffer/readout circuit, and the like, a controller 230A that controls the operation of the memory chip 100A, and an input/output circuit 240A connected to an input/output circuit 240A of the internal pad 120A. The memory chip 100B includes a memory cell array 210B formed having multiple NAND strings, a peripheral circuit 220B formed having a row selection circuit or a page buffer/readout circuit, and the like, a controller 230B that controls the operation of the memory chip 100B, and an input/output circuit 240B connected to an input/out circuit 240B of the internal pad 120B.

The memory chip 100A and the memory chip 100B are connected to the host computer 50 via the external terminal 110. Commands (such as reading, writing, erasing), addresses, and the like output from the host computer 50 are input to the memory chip 100A and the memory chip 100B via the external terminal 110 in the shared manner. The user may treat the memory chip 100A and the memory chip 100B as just a flash memory without identifying it.

In one embodiment, the controller 230A/230B monitors the address input from the host computer 50 via the input/output circuit 240A/240B, and determines based on the address whether itself has been selected. For example, if the input address is consistent with the address space of its own memory cell array 210A, the controller 230A determines that itself has been selected; if the input address is consistent with the address space of the memory cell array 210B, then the controller 230B determines that itself has been selected. When the memory chip 100A and the memory chip 100B have selected their own chips, the input commands are executed.

Figure 4:
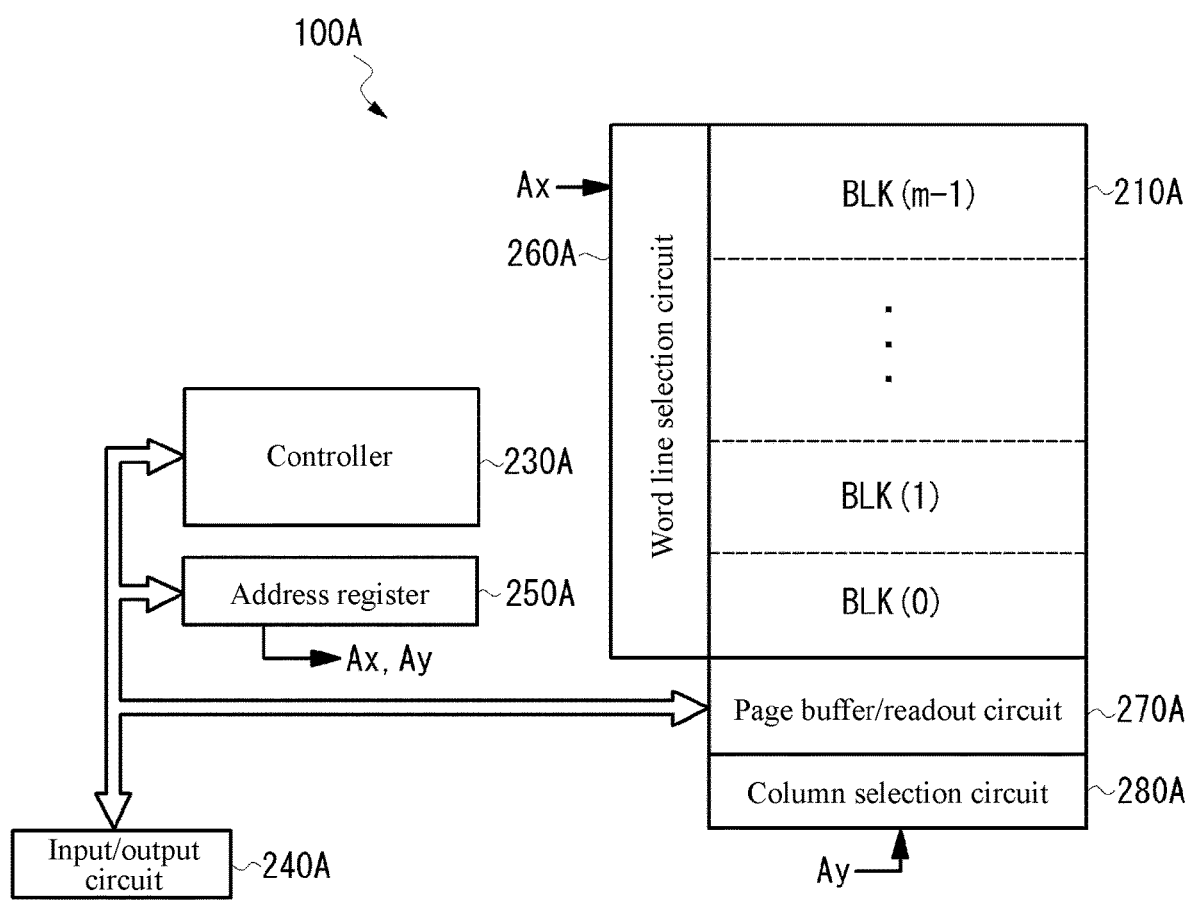
FIG. 4 is a diagram showing an internal configuration of a chip of a NAND-type flash memory according to an embodiment of the disclosure.

FIG. 4 is a diagram showing an internal configuration of the memory chip 100A. The memory chip 100A includes the following parts: the memory cell array 210A in which multiple memory cells are arranged in a matrix; the input/output circuit 240A inputting and outputting data via the external terminal 110; an address register 250A receiving the address via the input/output circuit 240A; the controller 230A controlling each part based on commands and the like received via the input/output circuit 240A; a word line selection circuit 260A performing block selection or word line selection based on a row address data Ax received from the address register 250A; a page buffer/readout circuit 270A holding the data read out from the page selected by the word line selection circuit 260A, or holding the data to be written to the selected page; and a column selection circuit 280A selecting a column of the page buffer/readout circuit 270A based on a column address data Ay received from the address register 250A. The memory chip 100B has the same configuration as the memory chip 100A, so the description thereof is omitted.

The memory cell array 210A includes m blocks BLK (0), BLK (1) . . . , BLK (m-1), arranged along the column direction, where multiple NAND strings are formed in one block. A NAND string includes multiple memory cells connected in series, a bit line side selection transistor, and a source line side selection transistor. The NAND string may be formed two-dimensionally on a surface of a substrate or three-dimensionally formed on a surface of a substrate. Further, the memory cell may be a type that stores one bit (binary data) or a type that stores multiple bits.

In the readout operation, a certain positive voltage is applied to the bit line, a certain voltage (for example, 0V) is applied to the selected word line, and a pass voltage Vpass (for example, 4.5V) is applied to the non-selected word line to turn on the bit line side selection transistor and the source line side selection transistor, and 0V is applied to a common source line. In the writing operation, a high-voltage write voltage (for example, 15V-20V) is applied to the selected word line, and an intermediate potential (for example, 10V) is applied to the non-selected word line to turn on the bit line side selection transistor, turn off the source line side selection transistor, and supply a potential corresponding to the data of "0" or "1" to the bit line. In the erasing operation, 0V is applied to the selected word line in the block, and a high voltage (for example, 20V) is applied to a P-well.

The page buffer/readout circuit 270A includes two latches L1 and L2 each capable of holding one page of data, and is capable of bidirectional data transfer between the latch L1 and the latch L2. A latch includes a first cache memory C1 and a second cache memory C2 that may be operated independently. A cache can hold ½ page of data; that is, it can transfer data between the latch L1 and the latch L2 in units of ½ page.

When the controller 230A receives a continuous readout command via the input/output circuit 240A, it controls the continuous readout operation from the start page to the final page. When continuous readout is performed, in a period where page data held by the latch L2 is output synchronously with an external clock signal CLK, the next page is read out from the memory cell array 210A, and the page data is held in the latch L1. The continuous readout of the page is performed through pipelines of the latch L1 and the latch L2. In the present embodiment, it is possible to perform seamless continuous readout without reducing a frequency of the clock signal CLK, and without inputting commands when continuous readout is performed between the memory chips.

Figure 5:
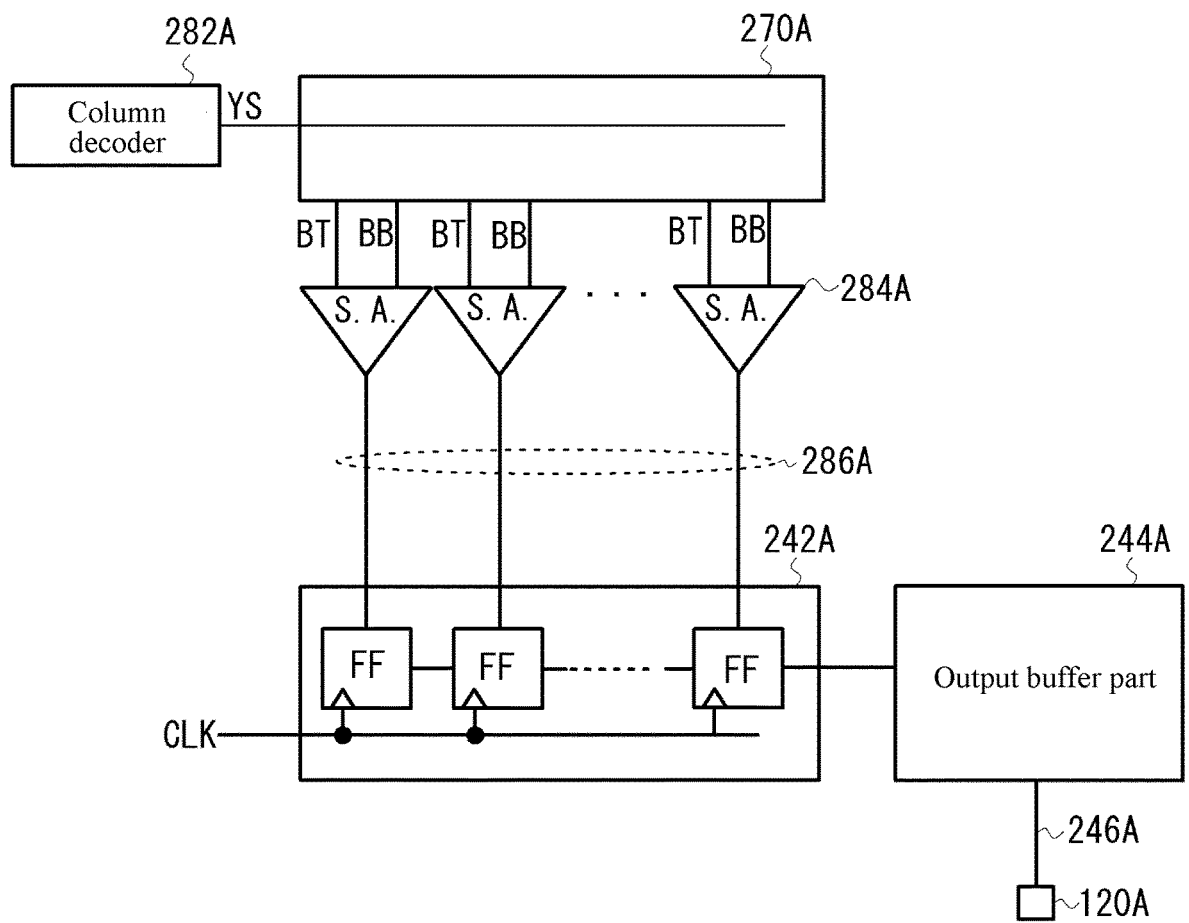
FIG. 5 is a diagram showing a configuration of an input/output circuit of a NAND-type flash memory according to an embodiment of the disclosure.

Next, the output part of the input/output circuit 240A of the present embodiment will be described with reference to FIGS. 2, 4, and 5. When the data held by the page buffer/readout circuit 270A is output, n-bit data are selected from the page data held by the latch L2 of the page buffer/readout circuit 270A through a column selection signal YS of the column selection circuit 280A. The column selection signal YS is generated by a column decoder 282A which decodes the column address data Ay. The selected n-bit data is registered as differential data in a bit line pair BT/BB of n differential readout amplifiers 284A. The differential readout amplifier 284A outputs the readout n-bit data to a parallel/serial conversion circuit 242A via a data bus 286A of n-bit width.

The parallel/serial conversion circuit 242A includes multiple flip-flops connected in series. The flip-flops convert the data in in parallel into serial data in synchronization with a clock signal CLK supplied from the outside or a clock signal obtained by dividing a frequency thereof and output the converted serial data to the output buffer part 244A. The output buffer part 244A outputs the input data to an input/output bus 246A. The input/output bus 246A is connected to the external terminal 110 via the internal pad 120A. When the external terminal 110 outputs data of m bits (for example, ×2, ×4, ×8, and the like), there are m output buffer part 244A and the input/output bus 246A.

The input/output circuit 240B of the memory chip 100B also the same configuration with the input/output circuit 240A, and the output buffer part 244B outputs the input data to the input/output bus 246B. The input/output bus 246B is connected to the external terminals 110 via the internal pads 120B. As shown in FIG. 2, one external terminal 110 is shared by the input/output bus 246A of the memory chip 100A and the input/output bus 246B of the memory chip 100B.

Figure 6:
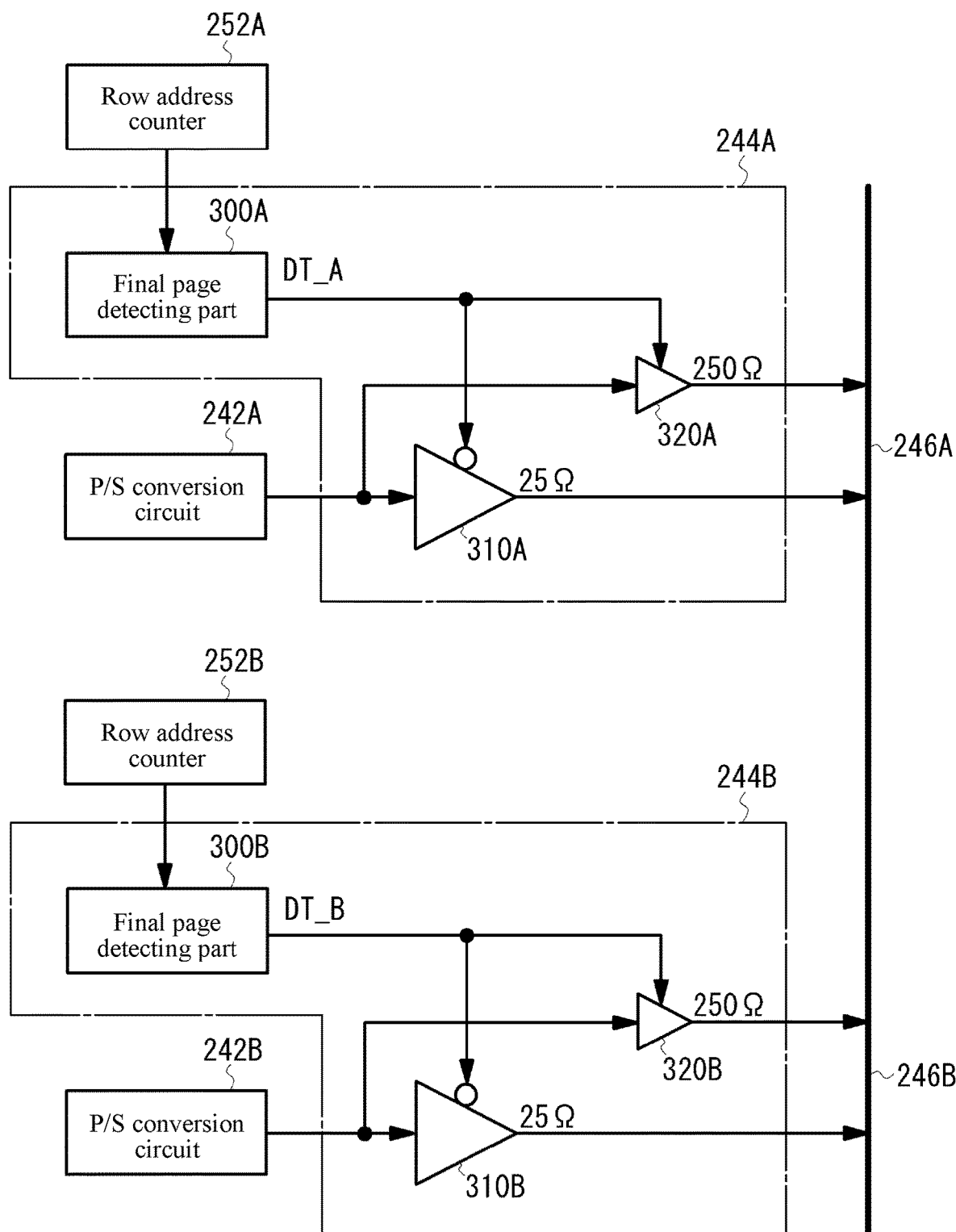
FIG. 6 is a diagram showing an internal configuration of an output buffer part according to an embodiment of the disclosure.

FIG. 6 is a diagram showing the internal configuration of the output buffer part 244A of the memory chip 100A and the output buffer part 244B of the memory chip 100B. The output buffer part 244A of the memory chip 100A includes: a final page detecting part 300A detecting the final page of the memory cell array 210A during the continuous readout operation; a first output buffer 310A receiving data from the parallel/serial conversion circuit (P/S conversion circuit) 242A, outputting the received data to the input/output bus 246A, and having a large driving capability; and a second output buffer 320A receiving data from the P/S conversion circuit 242A, outputting the received data to the input/output bus 246A, and having a small driving capability. The final page detecting part 300A outputs a detecting signal DT_A of H level to the first output buffer 310A and the second output buffer 320A when the final page is detected, and outputs a detecting signal DT_A of L level to the first output buffer 310A and the second output buffer 320A when the final page is not detected, so as to switch the operations of the first output buffer 310A and the second output buffer 320A. The output buffer part 244B of the memory chip 100B also has the same configuration, and its description is omitted here.

The final page detecting part 300A detects the final page based on the count data of a row address counter 252A. The row address counter 252A designates the page for continuous readout. When performing continuous readout, the address of the start page is set in the row address counter 252A, and each time when the final page is read out, the row address of the row address counter 252A is incremented so as to designate the next page. The final page detecting part 300A includes an address register that holds the final address in the address space of the memory cell array 210A, and a comparator that compares the final address with a count value of the row address counter 252A. When the count value matches the final addresses, the final page is detected.

The final page detecting part 300A also includes a delay circuit. When the final page is detected, the delay circuit adjusts a timing of outputting the detecting signal DT_A of H level. More specifically, at a timing (for example, Tp in FIG. 7B) when the host computer 50 can more reliably receive the data output from the first output buffer 310A, the delay circuit changes the detecting signal DT_A from L level to H level.

When the detecting signal DT_A is at L level, the first output buffer 310A is enabled, the second output buffer 320A is disabled, and the data output from the P/S conversion circuit 242A is output to the input/output bus 246A through the first output buffer 310A with a high driving capability. When the detecting signal DT_A is at H level, the first output buffer 310A is disabled, the second output buffer 320A is enabled, and the data output from the parallel/serial conversion circuit 242A is held by the second output buffer 320A with a small driving capability. In particular, the second output buffer 320A does not have sufficient driving capability to drive the input/output bus 246A and basically holds the data. For example, the first output buffer 310A sets an impedance of an output line connected to the input/output bus 246A to 25 ohms, and the second output buffer 320A sets an impedance of the output line connected to an input/output bus 246A to 250 ohms. Such a ratio of output impedance is an example, and it may be a ratio larger or smaller.

It should be noted here that the input/output bus 246A connected to the output buffer part 244A of the memory chip 100A and the input/output bus 246B connected to the output buffer part 244B of the memory chip 100B are electrically short-circuited. Under a condition of performing the continuous readout between the chips, it is ideal that the readout data of the final page of the memory chip 100A and the readout data of the start page of the memory chip 100B do not conflict on the input/output bus 246A and input/output bus 246B. However, in reality, owing to deviations in a wiring resistance configured to connect two physically separated memory chips 100A and 100B to the input/output bus 246A and the input/output bus 246B, or due to manufacturing deviations between the chips and the like, the readout data of the final page of the memory chip 100A may conflict with the readout data of the start page of the memory chip 100B. If conflict occurs between data with different logic levels, a large through current flowing between the output buffer part 244A and the output buffer part 244B may cause damage to the circuit or errors in the readout data. In the present embodiment, in order to prevent the above mentioned, when the data of the final page is output, the operation is switched from the first output buffer 310A to the second output buffer 320A. Even when conflicts occurs to the data, since the impedance of the second output buffer 320A is high, the through current between the output buffer part 244A and the output buffer part 244B is suppressed.

Next, the operation of continuous readout between the chips based on the present embodiment will be described. The command for continuous readout is input to the memory chip 100A and the memory chip 100B in a shared manner. The controller 230A of the memory chip 100A and the controller 230B of the memory chip 100B interpret the command for continuous readout and start the continuous readout operation. The controller 230A and the controller 230B automatically determine a boundary of the chips by identifying their own address spaces. For example, the storage size of the memory cell array 210A of the memory chip 100A and the memory cell array 210B of the memory chip 100B is 1G bits, and the row address counter 252A of the memory chip 100A and the row address counter 252B of the memory chip 100B count the address space of 2G bits. In the case of continuous readout starting from the specific address of the memory chip 100A, the memory chip 100A will perform the readout operation and increment the row address of the row address counter 252A, while the memory chip 100B will neither perform the readout operation nor increment the row address of the row address counter 252B. At the same time, the row address counter 252A and the row address counter 252B monitor the boundary between the memory chip 100A and the memory chip 100B; when the readout operation reaches the boundary between the memory chip 100A and the memory chip 100B, the memory chip 100A stops the readout and the memory chip 100B starts readout.

Figure 7A:
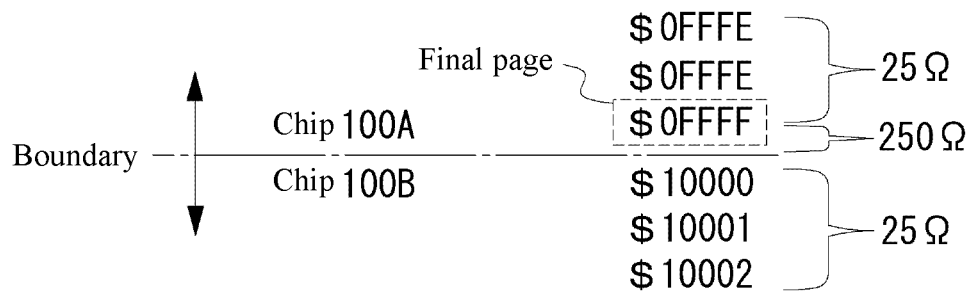
FIG. 7A and FIG. 7B are diagrams illustrating performing a continuous readout of an operation of an NAND-type flash memory according to an embodiment of the disclosure at a boundary close to a chip.
Figure 7B:
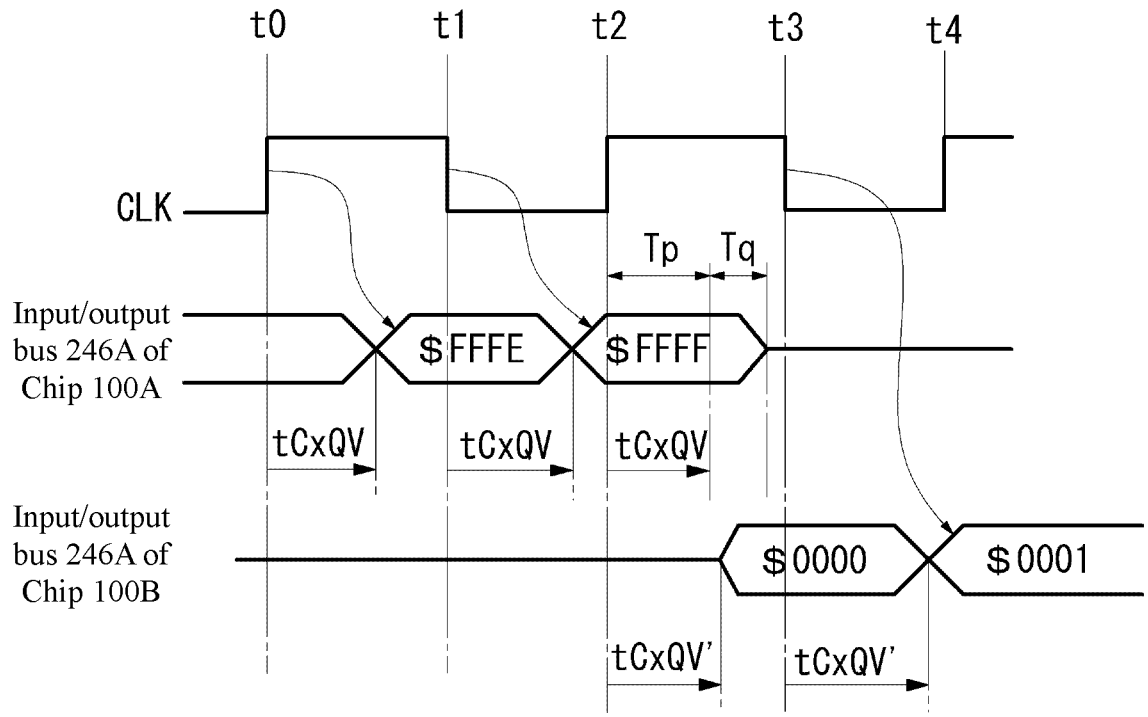

FIG. 7A shows the switching of the first output buffer 310A (310B) and the output buffer part 244A of the second output buffer 320A (320B) and of the output buffer part 244B when continuously readout near the boundary of the chips. FIG. 7B is a diagram showing the timing of the data output to the input/output bus 246A and the input/output bus 246B. Here, it is assumed that the continuous readout starts from the specific address of the memory chip 100A, and the continuous readout ends at the specific address of the memory chip 100B. The end of the continuous readout is implemented by, for example, the command from the host computer 50 or the designation of the final address.

Referring to FIGS. 6 and 7, when the continuous readout of the page is started, the output buffer part 244A outputs the data of the page read out to the input/output bus 246A synchronously with the clock signal CLK. During this period, the detecting signal DT_A of the final page detecting part 300A is at L level, and the first output buffer 310A with a large driving capability is configured to output the data. As shown in FIG. 7A, before the address "$0FFFF" of the final page is reached, the output impedance is 25 ohms. After the final page of the memory chip 100A is detected, the detecting signal DT_A changes from L level to H level at the timing after the host computer 50 reliably receives the data. Therefore, the readout data of the final page, after being output through the first output buffer 310A with a higher driving capability, is held by the second output buffer 320A with a lower driving capability.

In FIG. 7B, "tCxQV" is a maximum allowable time from a rising edge or a falling edge of the clock signal CLK to the output of the data to the input/output bus 246A, and "TCxQV'" is a maximum allowable time from the rising edge or the falling edge of the clock signal CLK to the output of data to the input/output bus 246B.

In response to time to, data of the previous page ($FFFE) of the final page is output to the input/output bus 246A; in response to time t1, the data of the final page ($FFFF) is output to the input/output bus 246A. The data of the final page is output by the first output buffer 310A with a large driving capacity during a period Tp, and the data is held by the second output buffer 320A with a small driving capacity during a Tq (Tp>Tq). In response to time t2, data of a start page ($0000) of the memory chip 100B is output to the input/output bus 246B; in response to time t3, data of the next page ($0001) is output to the input/output bus 246B.

Here, the period during which the memory chip 100A outputs the data of the final page and the period during which the memory chip 100B outputs the data of the start page may partially overlap. However, since the memory chip 100A puts the output buffer part 244A in a high impedance state during the period Tq, data loss of the start page of the memory chip 100B can be suppressed, or a through current is generated between the output buffer part 244B of the memory chip 100B and the output buffer part 244A via the input/output bus 246A and the input/output bus 246B. As a result, seamless access at high speed can be performed in the operation of continuous readout between the chips without reducing the frequency of the clock signal CLK.

In the described embodiment, an example of stacking two chips is shown, but the number of stacked chips may also be three or more.

It will be apparent to those skilled in the art that various modifications and variations can be made to the structure of the disclosure without departing from the scope or spirit of the disclosure. In view of the foregoing, it is intended that the disclosure cover modifications and variations of this disclosure provided they fall within the scope of the following claims and their equivalents.

What is claimed is:

1. A semiconductor storing apparatus comprising a plurality of NAND-type flash memory chips, wherein each of the plurality of NAND-type flash memory chips comprises:
   a readout part performing a continuous readout;
   an output part outputting data readout from the readout part to an output bus synchronously with a clock signal; and
   a detecting part detecting if a readout page read out by the readout part is a final page of a NAND-type flash memory chip among the plurality of NAND-type flash memory chips, wherein the detecting part detects the final page by comparing count data of a row address counter with an address space of the NAND-type flash memory chip,
   wherein the output part, under a condition that the continuous readout between the plurality of NAND-type flash memory chips is performed by the readout part and the final page of the NAND-type flash memory chip is detected by the detecting part, outputs data of the final page through a first output impedance, and then outputs or holds the data of the final page through a second output impedance higher than the first output impedance.

2. The semiconductor storing apparatus according to claim 1, wherein:
   the output part comprises:
      a first output buffer having the first output impedance; and
      a second output buffer having the second output impedance;
   wherein the output part selectively operates the first output buffer or the second output buffer based on a detecting signal from the detecting part.

3. The semiconductor storing apparatus according to claim 2, wherein:
   the output part responds to the final page being detected, operates the first output buffer in a first period, and operates the second output buffer in a second period after the first period.

4. The semiconductor storing apparatus according to claim 3, wherein:
   the first period is longer than the second period.

5. The semiconductor storing apparatus according to claim 1, wherein
   the plurality of NAND-type flash memory chips includes a first NAND-type flash memory chip and a second NAND-type flash memory chip,
   when a period of outputting the data of the final page of the first NAND-type flash memory chip partially overlaps a period of outputting the data of the start page of the second NAND-type flash memory chip, the data of the final page is output to the output bus through the second output impedance and the data of the start page is output to the output bus through the first output impedance.

6. The semiconductor storing apparatus according to claim 1, wherein:
   the plurality of NAND-type flash memory chips have the same configuration, and the plurality of NAND-type flash memory chips are respectively connected to a shared external terminal.

7. A readout method for a semiconductor storing apparatus, the semiconductor storing apparatus comprising a plurality of NAND-type flash memory chips, the readout method comprising:
   a first step, detecting a final page of a NAND-type flash memory chip among the plurality of NAND-type flash memory chips read out when a continuous readout is performed between the plurality of NAND-type flash memory chips synchronously with a clock signal, wherein the detecting step detects the final page by comparing count data of a row address counter with an address space of the NAND-type flash memory chip; and
   a second step, responding to the final page being detected and the continuous readout being performed, outputting data of the final page to an output bus through a first output impedance, and then outputting or holding the data of the final page to the output bus through a second output impedance higher than the first output impedance.

8. The readout method according to claim 7, wherein:
   the second step outputs the data of the final page through a first output buffer in a first period, and outputs or holds the data of the final page through a second output buffer in a second period after the first period.

9. The readout method according to claim 8, wherein:
   the first period is longer than the second period.

10. The readout method according to claim 7, wherein
    the plurality of NAND-type flash memory chips includes a first NAND-type flash memory chip and a second NAND-type flash memory chip,
    when a period of outputting the data of the final page of the first NAND-type flash memory chip partially overlaps a period of outputting the data of the start page of the second NAND-type flash memory chip, the data of the final page is output to the output bus through the second output impedance, and the data of the start page is output to the output bus through the first output impedance.

\* \* \* \* \*